(12) United States Patent
Inoue et al.

(10) Patent No.: US 7,170,370 B2
(45) Date of Patent: Jan. 30, 2007

(54) FILTER DEVICE CAPABLE OF OBTAINING ATTENUATION CHARACTERISTIC OF SHARPNESS IN NARROW BAND WIDTH AND BRANCHING FILTER USING THE SAME

(75) Inventors: Kenji Inoue, Tokyo (JP); Hisatoshi Saitou, Tokyo (JP)

(73) Assignee: TDK Corporation, Tokyo (JP)

( * ) Notice: Subject to any disclaimer, the term of this patent is extended or adjusted under 35 U.S.C. 154(b) by 133 days.

(21) Appl. No.: 10/843,568

(22) Filed: May 12, 2004

(65) Prior Publication Data

US 2004/0227587 A1 Nov. 18, 2004

(30) Foreign Application Priority Data

May 13, 2003 (JP) .............................. 2003-133898

(51) Int. Cl.
*H03H 9/54* (2006.01)
*H03H 9/64* (2006.01)

(52) U.S. Cl. ....................................... 333/189; 333/193
(58) Field of Classification Search ......... 333/193–196
See application file for complete search history.

(56) References Cited

U.S. PATENT DOCUMENTS

| | | | | |
|---|---|---|---|---|
| 5,506,552 A | * | 4/1996 | Seki et al. ................... | 333/195 |
| 5,654,680 A | * | 8/1997 | Kwan et al. ................. | 333/195 |
| 5,714,917 A | * | 2/1998 | Ella ........................... | 332/144 |
| 5,726,610 A | * | 3/1998 | Allen et al. .................. | 333/133 |
| 5,933,062 A | * | 8/1999 | Kommrusch ................ | 333/193 |
| 6,462,631 B2 | * | 10/2002 | Bradley et al. ............. | 333/189 |
| 6,472,954 B1 | * | 10/2002 | Ruby et al. .................. | 333/133 |
| 6,653,913 B2 | * | 11/2003 | Klee et al. ................... | 333/188 |
| 6,741,145 B2 | * | 5/2004 | Tikka et al. ................. | 333/133 |

FOREIGN PATENT DOCUMENTS

| | | | |
|---|---|---|---|
| EP | 0 788 224 A1 | | 8/1997 |
| EP | 1 253 713 A2 | | 10/2002 |
| JP | 7-154199 | * | 6/1995 |
| JP | 7-273597 | * | 10/1995 |
| JP | 7-283688 | * | 10/1995 |
| JP | 8-65089 | * | 3/1996 |
| JP | 9-167937 | * | 6/1997 |
| JP | 10-93375 | | 4/1998 |
| JP | 2001-44790 | * | 2/2001 |

OTHER PUBLICATIONS

European Search Report dated Aug. 29, 2006.

* cited by examiner

*Primary Examiner*—Barbara Summons
(74) *Attorney, Agent, or Firm*—McGinn IP Law Group, PLLC

(57) ABSTRACT

In a filter device 10 constituted by circuit elements formed on a single substrate 11, the circuit elements includes a first wing section 14 formed between an input signal electrode 12 and an output signal electrode 13, first resonators 15a, 15b, 15c located in the first wiring section 14 and having a predetermined resonance frequency, second wiring sections 17a, 17b, 17c, 17d formed between the first wiring section 14 and a ground electrode 16, second resonators 18a, 18b, 18c, 18d located in the second wiring sections 17a, 17b, 17c, 17d and having an anti-resonance frequency forming a pass-band with the predetermined resonance frequency of the first resonators 15a, 15b, 15c. An effective electric and mechanical coupling factor of the second resonator 18a is different from those of the other resonators 15a, 15b, 15c, 18b, 18c, 18d.

5 Claims, 18 Drawing Sheets

FILTER DEVICE CAPABLE OF OBTAINING ATTENUATION CHARACTERISTIC OF SHARPNESS IN NARROW BAND WIDTH AND BRANCHING FILTER USING THE SAME

BACKGROUND OF THE INVENTION

The present invention relates to a filter device and a branching filter using the filter device, in particular to a technique effectively applicable to an improvement of sharpness of filter characteristic between pass band and prohibition band in the filter device.

In recent years, a mobile communication terminal equipment, such as a portable telephone and the like has been rapidly developed. Subsequently, it is desired that the mobile communication terminal equipment is small in size, light in weight and capable of saving electric power for the purpose of convenience for portability thereof. In order that the mobile communication terminal equipment may be small in size, light in weight and capable of saving electric power, it is necessary that the filter device used therein is not only small in size and light in weight but also low in insertion loss. Further, from the view point of high speed and large capacity communication, it is also required that the filter device has a wide pass band characteristic.

In order to meet the requirement, many filter devices each of which a plurality of resonators are connected to each other like a comb, namely ladder type filters are used as a filter device of the mobile communication terminal equipment. An SAW resonator using surface acoustic wave (SAW), a piezo-electric resonator composed of a crystal vibrator using bulk acoustic wave (BAW), and the like is used as each of the resonators for constituting the ladder type filter. It has recently been known that the ladder type filter may be constituted by thin film resonators each using a thin film of piezo-electricity.

In order to realize a ladder type filter capable of having a wide pass-band characteristic, for example, Japanese unexamined patent publication Hei 10-93375, namely No. 93375/1998 discloses a technique that an inductance element is added in a parallel arm or that frequency differences are made between resonance frequencies of resonators formed in a serial arm and anti-resonance frequencies of resonators formed in a parallel arm.

It is, of course, necessary in a filter device that an insertion loss at a pass-band frequency fulfills a predetermined specification. In addition, it is also necessary in the filter device that a large amount of attenuation fulfilling a predetermined specification is obtained at a cut-off frequency (a pass-band frequency at the side of a communication partner in a transmission/reception filter device).

In addition, the filter device has not only pressure temperature dependence that temperature of the filter device varies characteristics thereof but also individual difference due to unevenness of manufacturing the filter device. It is therefore necessary not only that pass-band width capable of obtaining the insertion loss fulfilling the above specification is enlarged but also that cut-off band width capable of obtaining the amount of attenuation fulfilling the described specification is enlarged. As a result, the pass-band and the cut-off band become close to each other.

However, in the above-described conventional technique, especially when the pass-band and the cut-off band become close to each other, it is not possible to obtain sufficiently sharp attenuation characteristics. Consequently, when characteristics of the conventional filter device are varied due to environmental temperature for using the filter device and individual differences of the products thereof, desirable characteristics thereof cannot be obtained.

SUMMARY OF THE INVENTION

It is therefore an object of the present invention to provide a filter device which is capable of obtaining attenuation characteristic of sharpness in a narrow band width.

Other objects of the present invention will become clear as the description proceeds.

According to an aspect of the present invention, there is provided a filter device which is constituted by circuit elements formed on a single substrate, said circuit elements comprising: a first wiring section which is formed between an input signal electrode and an output signal electrode; at least one first resonator which is located in said first wiring section and which has a predetermined resonance frequency; at least one second wiring section which is formed between said first wiring section and a ground electrode, a second resonator which is located in said second wiring section and which has an anti-resonance frequency forming a pass-band with said predetermined resonance frequency of said at least one first resonator) and an effective electric and mechanical coupling factor of at least any one of said first and second resonators being different from those of the other resonators.

Subsequently, the filter device becomes capable of obtaining attenuation characteristic of sharpness in a narrow band width by making the effective electric and mechanical coupling factor of at least any one of the first and the second resonators be different from those of the other resonators.

Preferably, said resonator of which the effective electric and mechanical coupling factor is different from those of the other resonators may be determined to be between a frequency in the pass-band side edge in the attenuation band of the filter device and a frequency in the attenuation band side edge in the pass-band of the filter device.

Thus, it becomes possible to obtain attenuation characteristic of sharpness in a narrow band width by making the effective electric and mechanical coupling factor of the resonator be different from those of the other resonators.

Further preferably, a plurality of said second resonators may be located in said second wiring sections, the effective electric and mechanical coupling factor of a part of said second resonators may be different from those of the other said second resonators and said first resonator.

Subsequently, attenuation characteristic of sharpness can be obtained at a frequency side lower than the pass-band.

Further preferably, said second resonator has a value of the effective electric and mechanical coupling factor different from those of the first resonator while the other said second resonator has the same value thereof as those of the first resonator, an impedance of said second resonator may be made lower than those of the other said second resonator.

Subsequently, attenuation characteristic of sharpness can be obtained even in a narrower band width.

Further preferably, a plurality of said first resonators may be located in said first wiring sections, the effective electric and mechanical coupling factor of a part of said first resonators may be different from those of the other said first resonators and said second resonator.

Subsequently, attenuation characteristic of sharpness can be obtained at a frequency side higher than the pass-band.

Further preferably, said first resonator has a value of the effective electric and mechanical coupling factor different from those of the second resonator while the other said first resonator has the same value thereof as those of the second resonator, an impedance of said first resonator may be made lower than those of the other said first resonator, Subsequently, attenuation characteristic of sharpness can be obtained even in a narrower band width.

Further preferably, anti-resonance frequency of said second resonator may be made higher than resonance frequency of said first resonator having the same value of the effective electric and mechanical coupling factor as those of said second resonator.

Subsequently, attenuation characteristic of sharpness can be obtained even in a narrower band width.

Further preferably, the effective electric and mechanical coupling factor of said first resonator is different from that of said second resonator.

Subsequently, attenuation characteristic of sharpness can be obtained in a narrow band width.

Further preferably, said first resonator and said second resonator may be SAW resonators each using surface acoustic wave (SAW).

Subsequently, attenuation characteristic of sharpness can be obtained in a narrow band width.

Further preferably, said first resonator and said second resonator may be piezo-electric resonators each using balk acoustic wave (BAW).

Subsequently, attenuation characteristic of sharpness can be obtained in a narrow band width.

Further preferably, said piezo-electric resonators may be diaphragm-type piezoelectric resonators or SMR (Solidly Mounted Resonator) type piezo-electric resonators.

Subsequently, attenuation characteristic of sharpness can be obtained in a narrow band width.

Further preferably, the effective electric and mechanical coupling factor of said resonator is different from those of the other resonators by a capacitance element connected in serial or in parallel to the resonator.

Subsequently, a compact filter device having attenuation characteristic of sharpness in a narrow band width can be obtained.

Further preferably, the effective electric and mechanical coupling factor of said resonator may be different from those of the other resonators by making normalized film thickness or duty of said resonator be different from those of the other resonators.

Subsequently, a compact filter device having attenuation characteristic of sharpness in a narrow band width can be obtained.

Further preferably, the effective electric and mechanical coupling factor of said resonator may be different from those of the other resonators by making film thickness of an oxide film formed on a surface of a piezo-electric film constituting said resonator be different from those of the other resonators.

Subsequently, a compact filter device having attenuation characteristic of sharpness in a narrow band width can be obtained.

Further preferably, the effective electric and mechanical coupling factor of said resonator may be different from those of the other resonators by making an area of an electrode constituting said resonator be different from those of the other resonators.

Subsequently, a compact filter device having attenuation characteristic of sharpness in a narrow band width can be obtained.

Further preferably, the effective electric and mechanical coupling factor of said resonator may be different from those of the other resonators by making film thickness of an electrode constituting said resonator be different from those of the other resonators.

Subsequently, a compact filter device having attenuation characteristic of sharpness in a narrow band width can be obtained.

According to another aspect of the present invention, there is also provided a branching filter comprising a plurality of filter devices each of which is constituted by circuit elements formed on a single substrate, said circuit elements including: a first wiring section which is formed between an input signal electrode and an output signal electrode; at least one first resonator which is located in said first wiring section and which has a predetermined resonance frequency; at least one second wiring section which is formed between said first wiring section and a ground electrode; a second resonator which is located in said second wiring section and which has an anti-resonance frequency forming a pass-band with said predetermined resonance frequency of said at least one first resonator; and an effective electric and mechanical coupling factor of at least any one of said first and second resonators being different from those of the other resonators.

Subsequently, the branching filter becomes capable of obtaining attenuation characteristic of sharpness in a narrow band width.

DETAILED DESCRIPTION OF THE PREFERRED EMBODIMENTS

Figure 1:
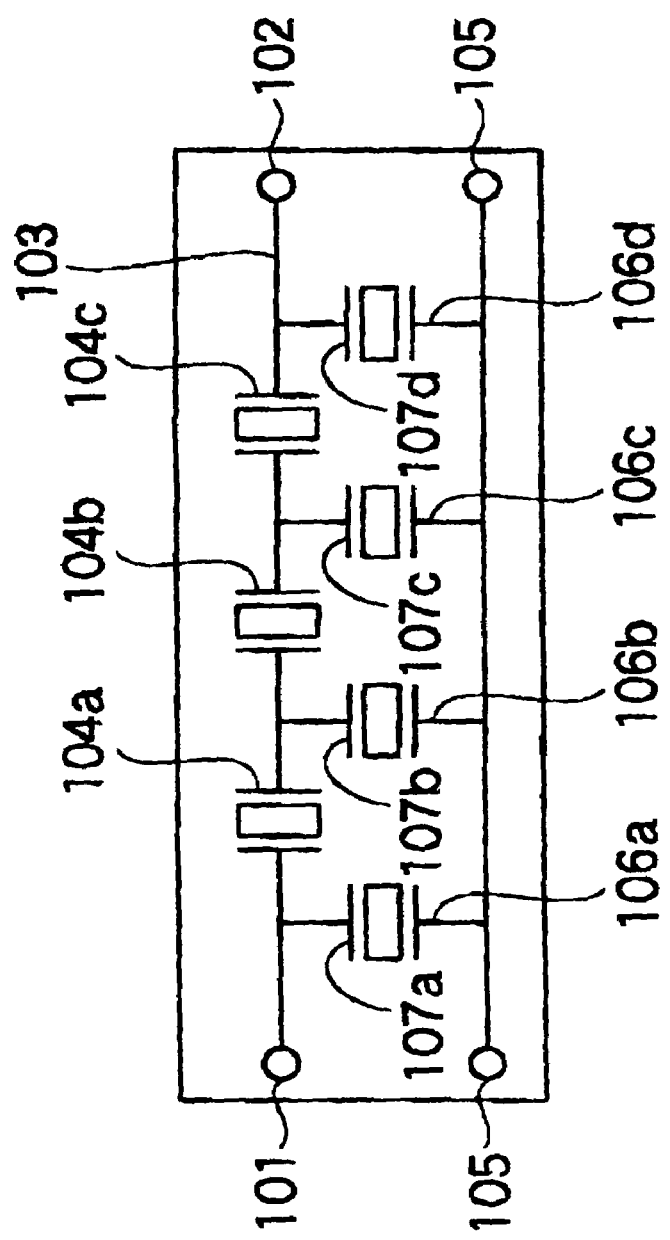
FIG. 1 is an equal circuit diagram for showing an example of a constitution of a conventional ladder type filter.
Figure 2:
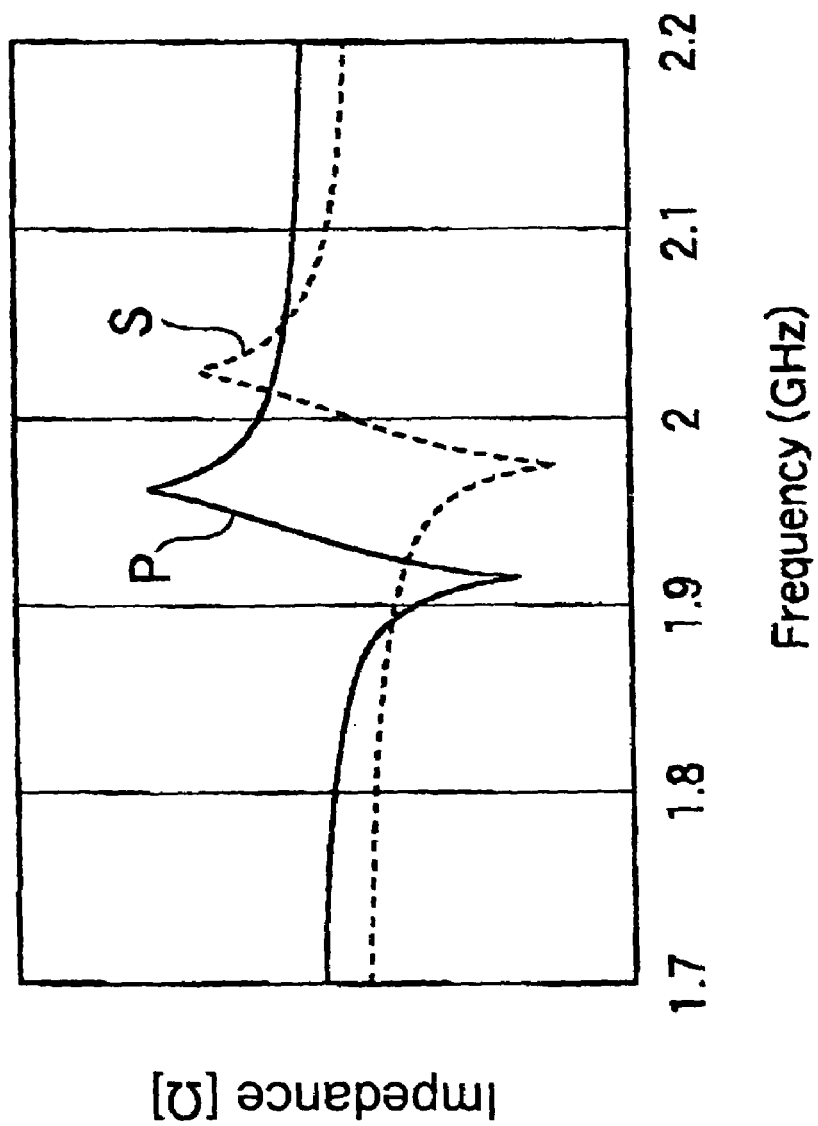
FIG. 2 is a graph for showing respective impedance characteristics of the resonator S formed in the serial arm and the resonator P formed in the parallel arm both used in the conventional ladder type filter.
Figure 3:
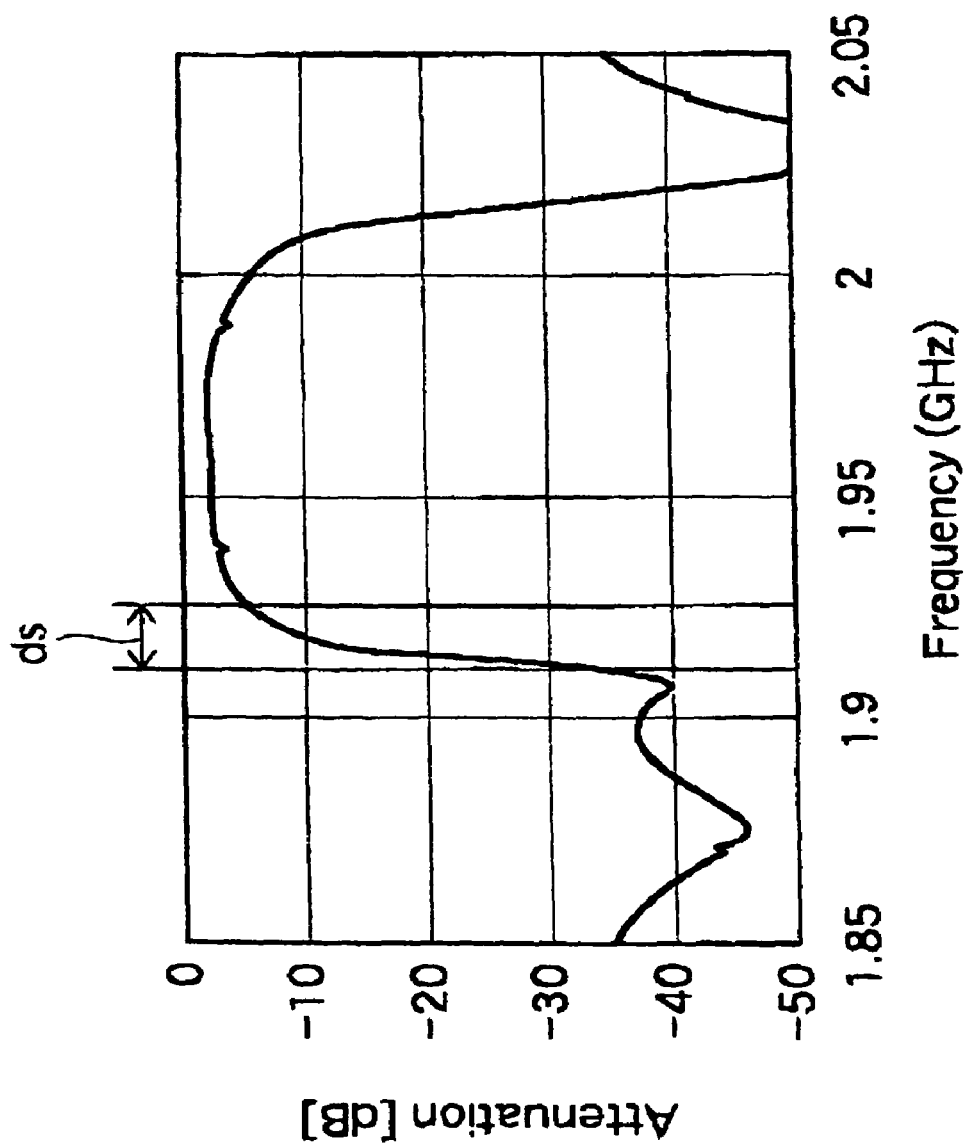
FIG. 3 is a graph for showing an example of the pass-band characteristic of a ladder type filter using such resonators.

Referring to FIGS. 1 through 3, description is, at first, made about a conventional ladder type filter as the conventional filter device mentioned in the preamble of the instant specification in order to facilitate an understanding of the present invention.

In FIG. 1, illustrated is an equal circuit of an example of a constitution of the conventional ladder type filter. As illustrated in FIG. 1, the conventional ladder type filter comprises a first wiring section 103, three resonators 104a, 104b, 104c, second wiring sections 106a, 106b, 106c, 106d, and four resonators 107a, 107b, 107c and 107d. The first wiring section 103 is formed between an input signal electrode 101 and an output signal electrode 102 as a serial arm. The three resonators 104a, 104b, 104c are connected in serial to the first wiring section 103. The second wiring sections 106a, 106b, 106c, 106d are formed as parallel arms. The second wiring section 106a is formed between a ground electrode 105 and an intermediate point of the input signal electrode 101 and the resonator 104a. The second wiring section 106b is formed between the ground electrode 105 and an intermediate point of the resonator 104a and the resonator 104b. The second wiring section 106c is formed between the ground electrode 105 and an intermediate point of the resonator 104b and the resonator 104c. The second wiring section 106d is formed between the ground electrode 105 and an intermediate point of the output signal electrode 102 and the resonator 104c. The four resonators 107a, 107b, 107c, 107d are connected in parallel through the second wiring sections 106a, 106b, 106c, 106d, respectively.

In order to realize such a ladder type filter capable of having a wide pass-band characteristic, for example, Japanese unexamined patent publication Hei 10-93375, namely No. 93375/1998 discloses a technique that an inductance element is added in a parallel arm or that frequency differences are made between resonance frequencies of resonators formed in a serial arm and anti-resonance frequencies of resonators formed in a parallel arm.

Herein, in FIG. 2, illustrated are respective impedance characteristics of the resonator S formed in the serial arm and the resonator P formed in the parallel arm both used in the conventional ladder type filter thus illustrated. Besides, generally speaking, impedances and frequencies are fairly changed in each of resonators formed in a serial arm and a parallel arm so that required insertion loss and attenuating amount may be achieved. However, in FIG. 2, for the brevity of explanation, illustrated are only the respective impedance characteristics of one resonator S formed in the serial arm and one resonator P formed in the parallel arm. Further, in FIG. 3, illustrated is an example of the pass-band characteristic of a ladder type filter using such resonators. Besides in each resonator formed in the parallel arm, an inductor component of a path connected to a ground plane is adequately adjusted in order that the attenuation may be obtained at a desired frequency band.

Herein, let a difference ds be considered in FIG. 3 so as to estimate an attenuation characteristic of the ladder type filter. The ds is defined as a difference between a frequency at which the attenuation is −4 dB and a frequency at which the attenuation is −35 dB. As will be understood from FIG. 3, the attenuation characteristic becomes sharper, the difference ds becomes smaller. The difference ds at a lower frequency side of the pass-band was determined in the conventional ladder type filter illustrated in FIG. 3, so that the difference ds was 18.2 MHz.

It is, of course, necessary in a filter device that an insertion loss at a pass-band frequency fulfills a predetermined specification. In addition, it is also necessary in the filter device that a large amount of attenuation fulfilling a predetermined specification is obtained at a cut-off frequency (a pass-band frequency at the side of a communication partner in a transmission/reception filter device). For example, it is necessary that a transmission filter fulfills an insertion loss of 3.8 dB at a pass-band frequency. In addition, it is also necessary that the transmission filter obtains an amount of attenuation of −37 dB at a frequency band (cut-off frequency band) of 20 MHz higher than the pass-band frequency. In other words, a difference of 33.2 dB between higher and lower frequencies must be made within a frequency band of 20 MHz.

Now, referring to FIGS. 4 through 13, description will proceed to a filter device according to a first embodiment of the present invention.

Figure 4:
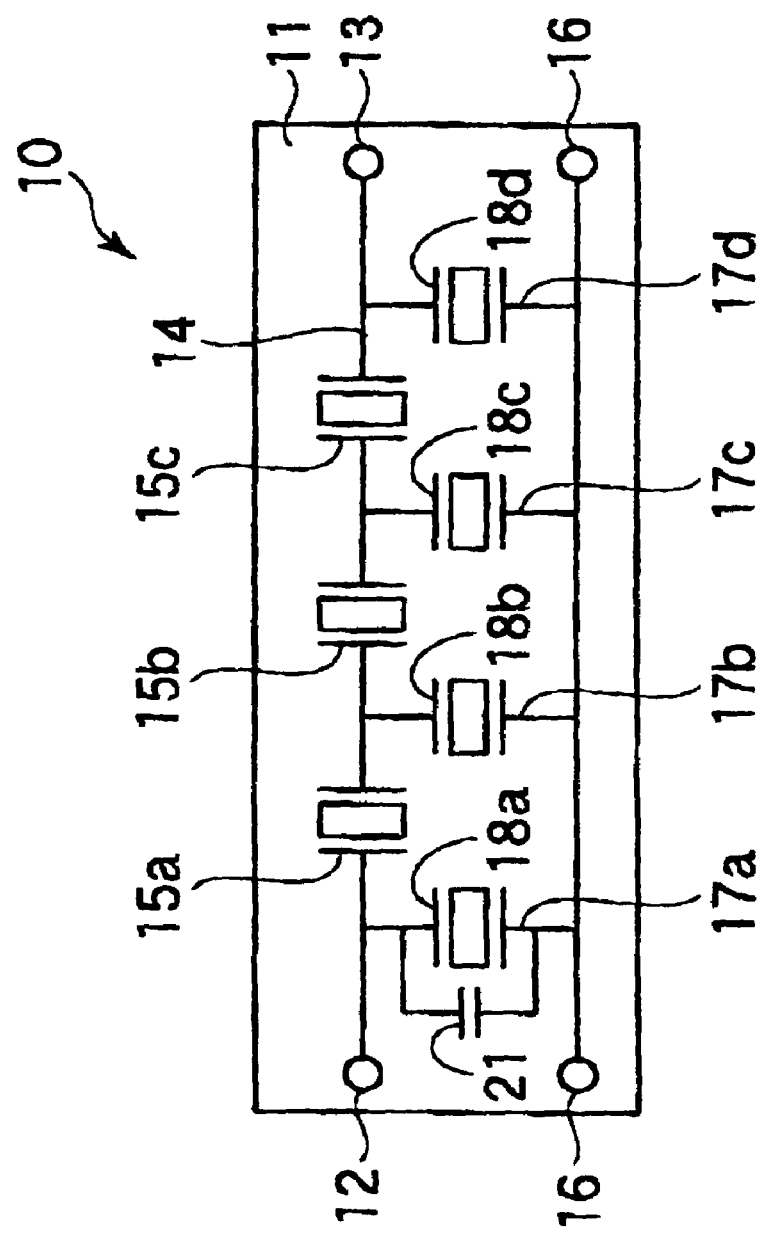
FIG. 4 is an equal circuit diagram for schematically showing a constitution of the filter device according to the first embodiment of the present invention.
Figure 5:
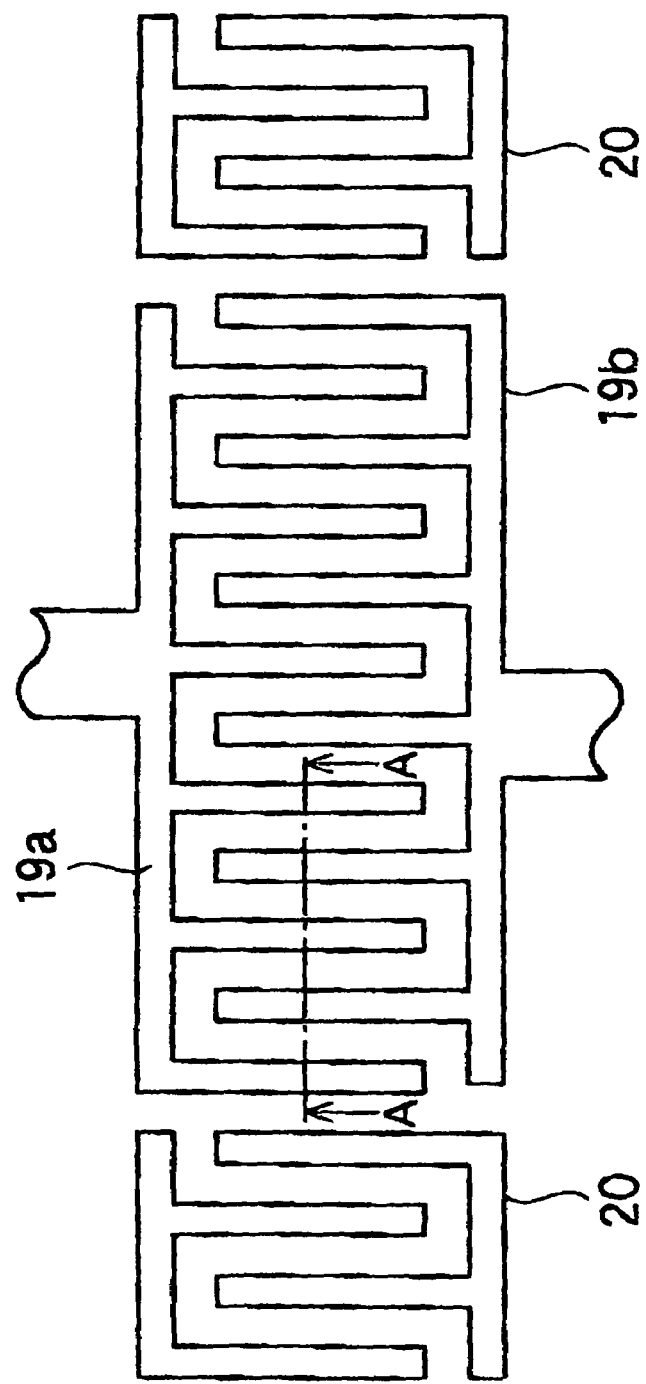
FIG. 5 is an explanation view for schematically showing a constitution of an SAW resonator as an example of a resonator used in the filter device illustrated in FIG. 4.
Figure 6:
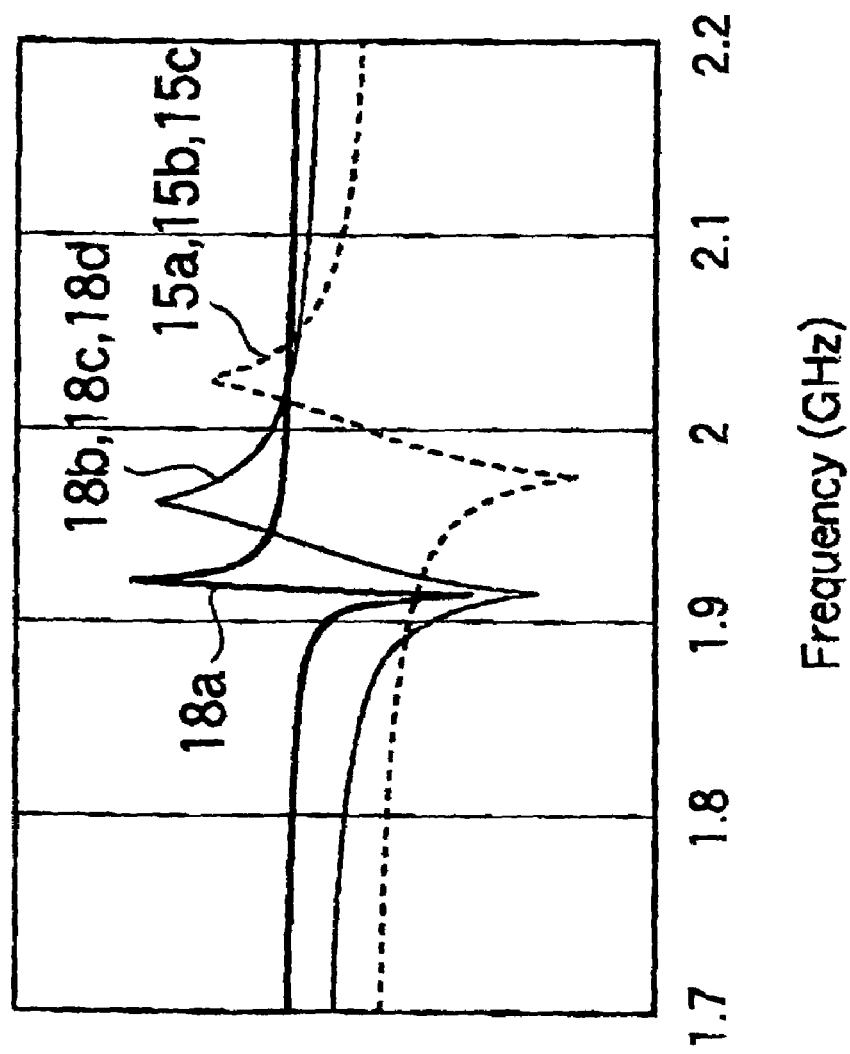
FIG. 6 is a graph for showing an example of impedance characteristics of the resonators in the filter device illustrated in FIG. 4.
Figure 7:
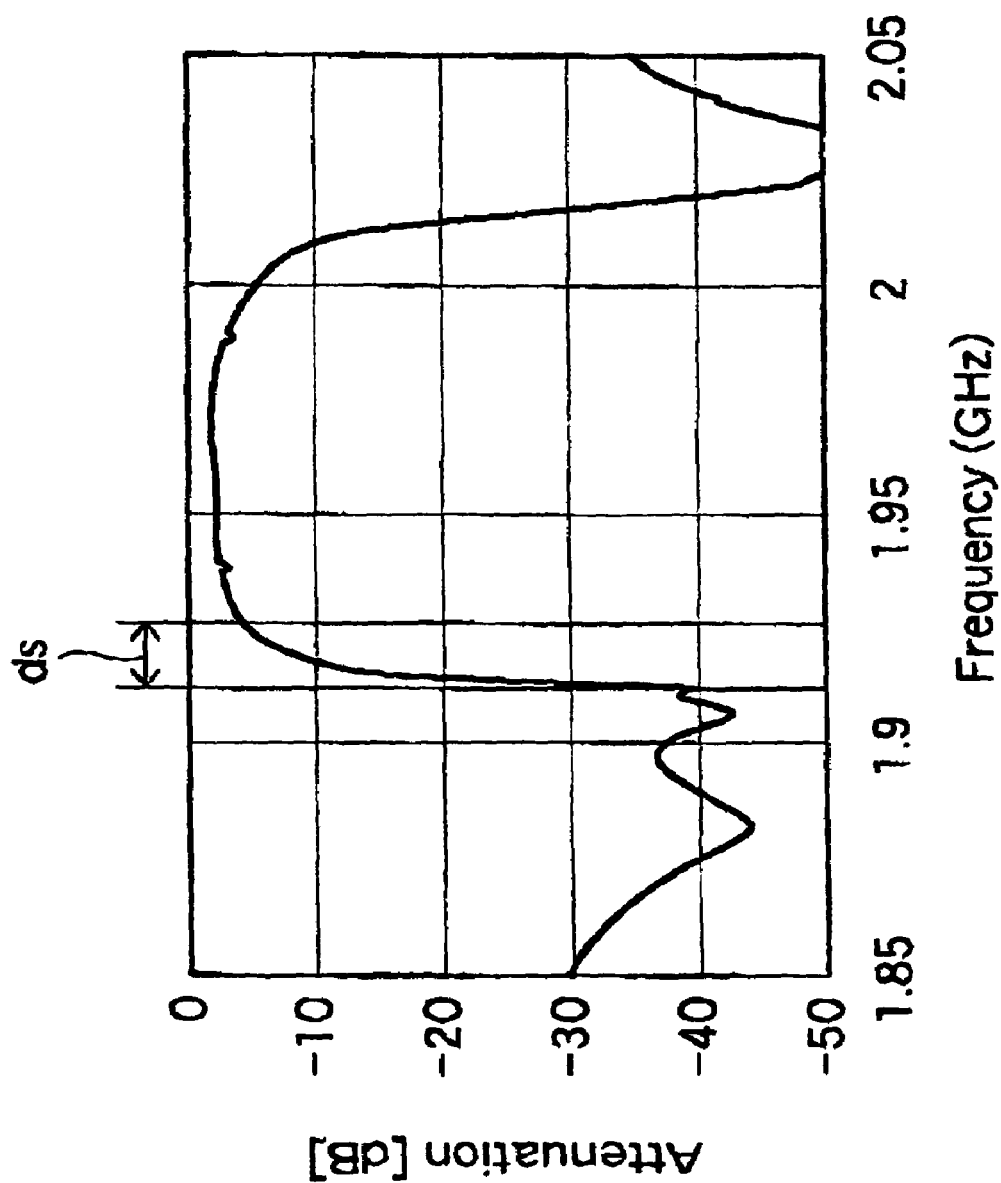
FIG. 7 is a graph for showing a pass-band characteristic of the filter device using the resonators of the impedance characteristics illustrated in FIG. 6.
Figure 8:
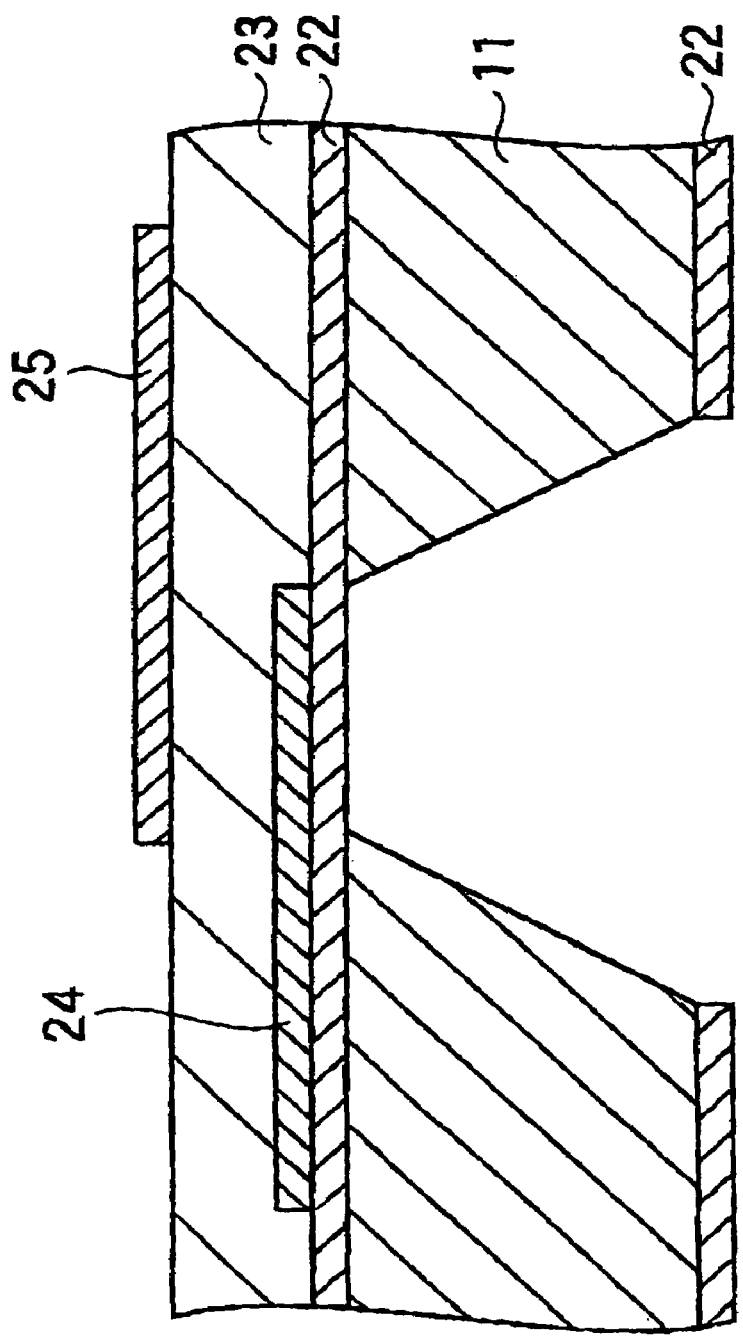
FIG. 8 is a sectional view for schematically showing a structure of a piezo-electric resonator as another example of a resonator used in the filter device illustrated in FIG. 4.
Figure 9:
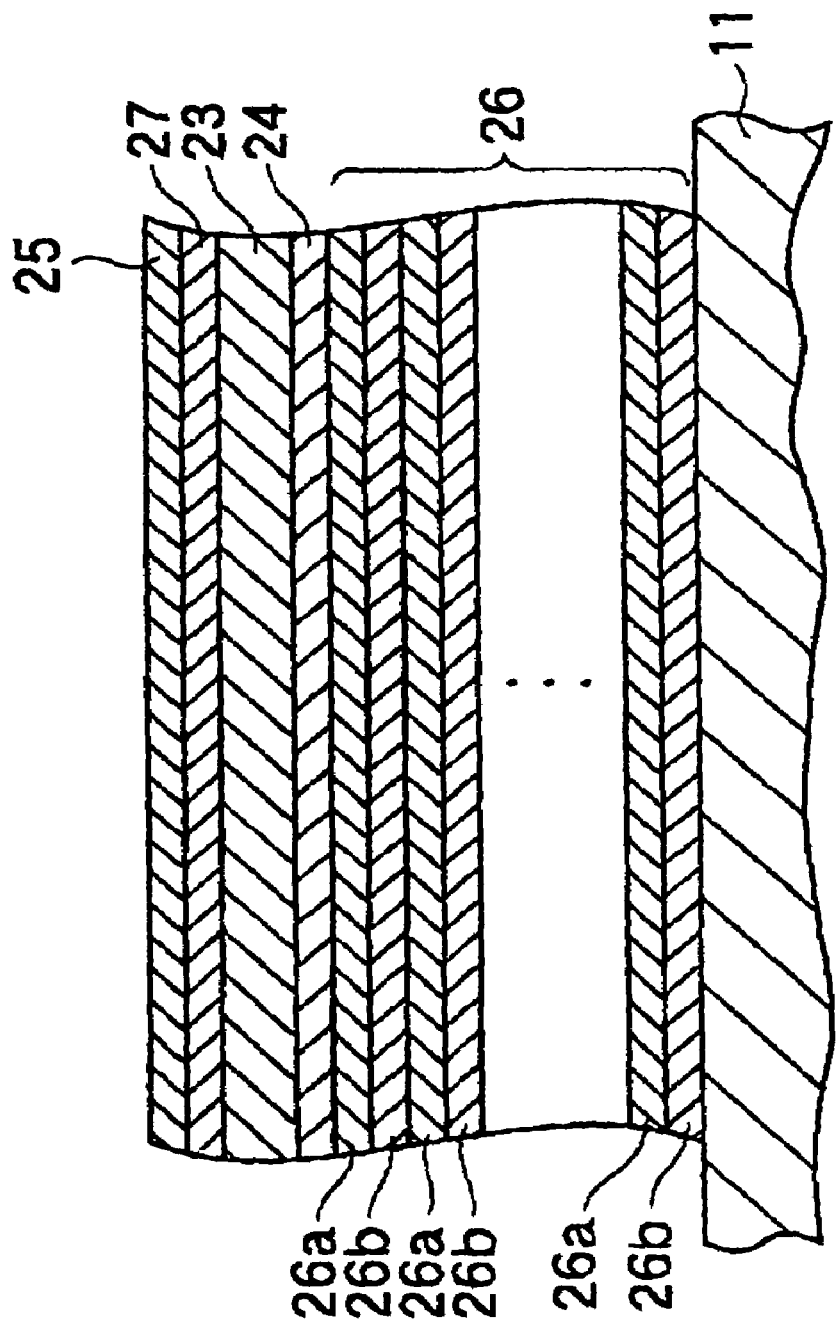
FIG. 9 is a sectional view for schematically showing a structure of a piezo-electric resonator as yet another example of a resonator used in the filter device illustrated in FIG. 4.
Figure 10:
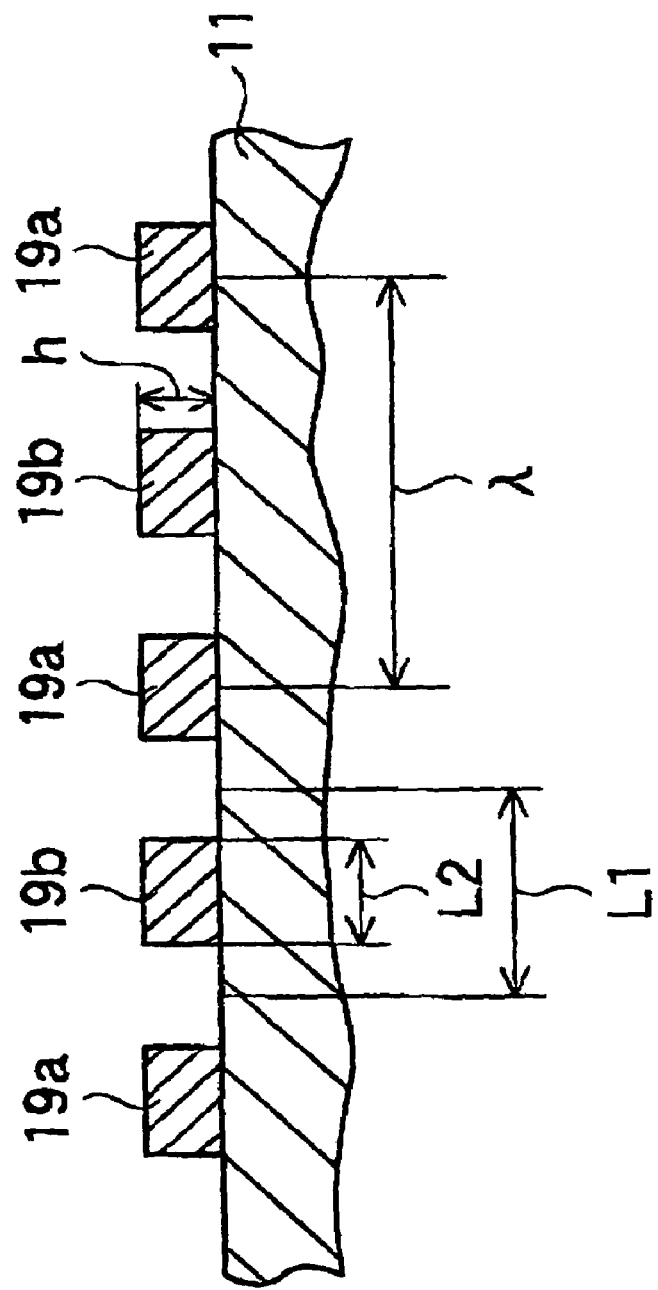
FIG. 10 is a sectional view for schematically showing the SAW resonator taken from A—A line in FIG. 5.
Figure 11:
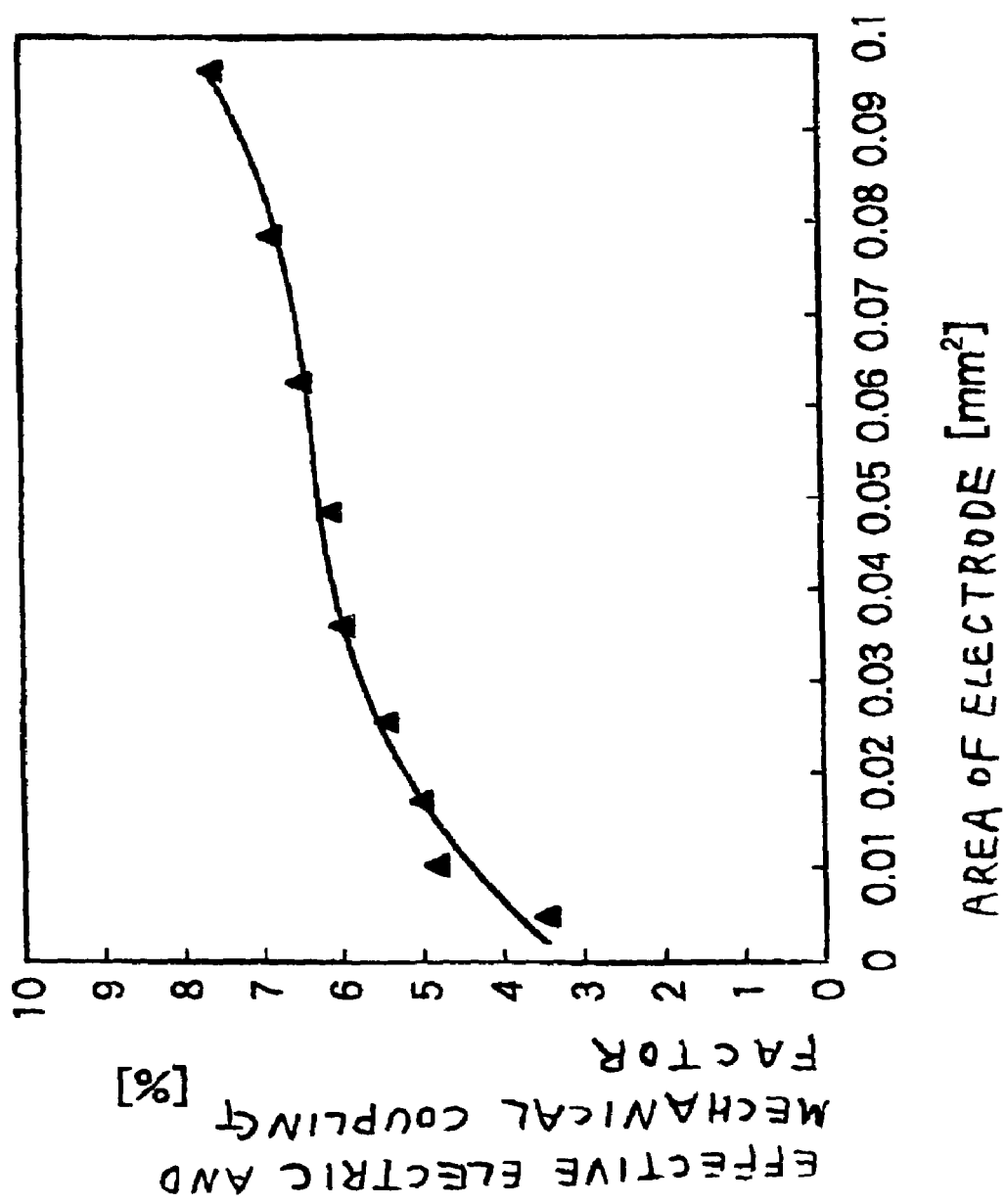
FIG. 11 is a graph for showing a relation between an area of an electrode and electric and mechanical coupling factor in a piezo-electric resonator.
Figure 12:
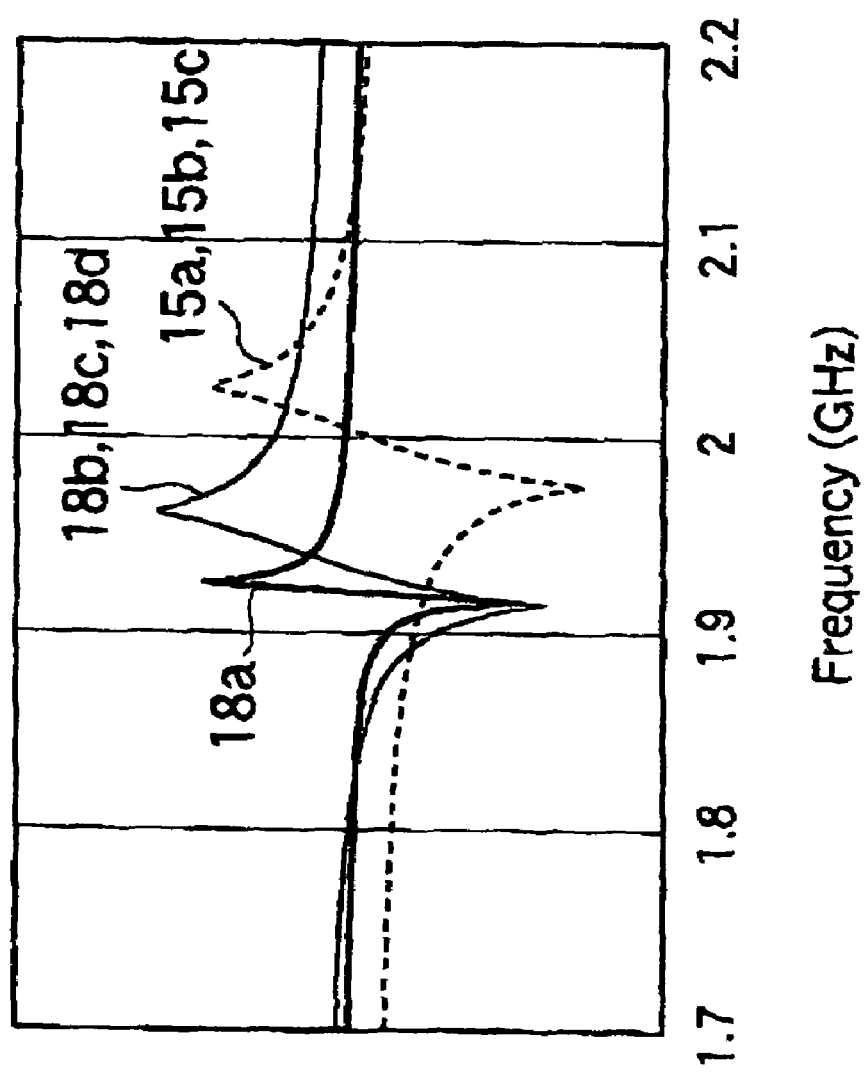
FIG. 12 is a graph for showing another example of impedance characteristics of the resonators in the filter device illustrated in FIG. 4.
Figure 13:
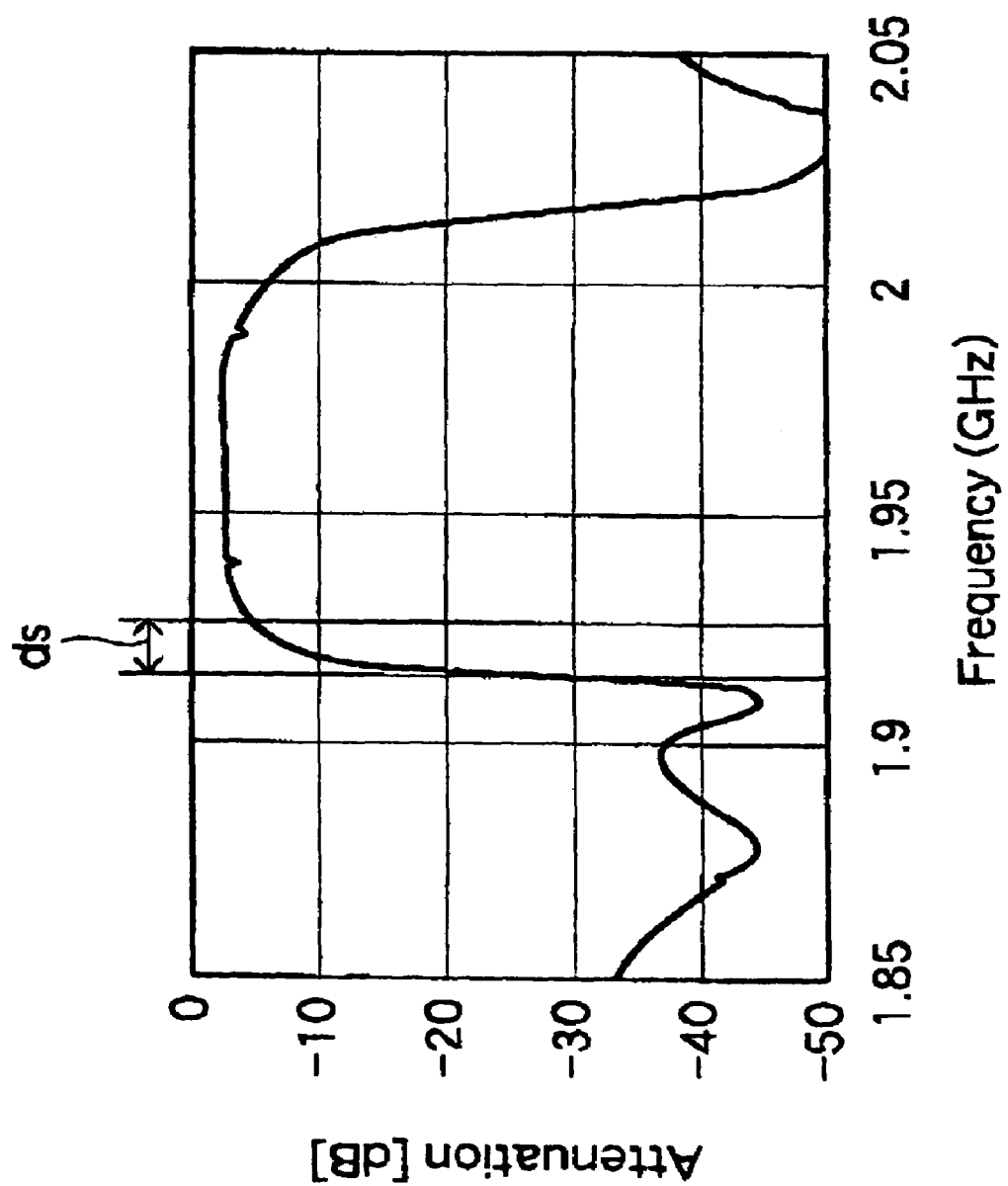
FIG. 13 is a graph for showing a pass-band characteristic of the filter device using the resonators of the impedance characteristics illustrated in FIG. 12.

FIG. 4 is an equal circuit diagram for schematically showing a constitution of the filter device according to the first embodiment of the present invention FIG. 5 is an explanation view for schematically showing a constitution of an SAW resonator as an example of a resonator used in the filter device illustrated in FIG. 4. FIG. 6 is a graph for showing an example of impedance characteristics of the resonators in the filter device illustrated in FIG. 4. FIG. 7 is a graph for showing a pass-band characteristic of the filter device having the impedance characteristics illustrated in FIG. 6. FIG. 8 is a sectional view for schematically showing a structure of a piezo-electric resonator as another example of a resonator used in the filter device illustrated in FIG. 4. FIG. 9 is a sectional view for schematically showing a structure of a piezo-electric resonator as yet another example of a resonator used in the filter device illustrated in FIG. 4. FIG. 10 is a sectional view for schematically showing the SAW resonator taken from A—A line in FIG. 5. FIG. 11 is a graph for showing a relation between an area of an electrode and electric and mechanical coupling factor in a piezo-electric resonator. FIG. 12 is a graph for showing another example of impedance characteristics of the resonators in the filter device illustrated in FIG. 4. FIG. 13 is a graph for showing a pass-band characteristic of the filter device having the impedance characteristics illustrated in FIG. 12.

In FIG. 4, the filter device 10 according to the first embodiment comprises predetermined circuit elements formed on a single substrate 11. As illustrated in FIG. 4, the filter device 10 comprises a first wiring section (serial arm) 14, three resonators (first resonators) 15a, 15b, 15c, second wiring sections (parallel arms) 17a, 17b, 17c, 17d, and four resonators (second resonators) 18a, 18b, 18c and 18d, as the circuit elements.

The first wiring section 14 is formed between an input signal electrode 12 and an output signal electrode 13 as a serial arm. The three resonators 15a, 15b, 15c are connected in serial to the first wiring section 14. The second wiring sections 17a, 17b, 17c, 17d are formed as parallel arms. The second wiring section 17a is formed between a ground electrode 16 and an intermediate point of the input signal electrode 12 and the resonator 15a. The second wiring section 17b is formed between the ground electrode 16 and an intermediate point of the resonator 15a and the resonator 15b. The second wiring section 17c is formed between the ground electrode 16 and an intermediate point of the resonator 15b and the resonator 15c. The second wiring section 17d is formed between the ground electrode 16 and an intermediate point of the output signal electrode 13 and the resonator 15c. The four resonators 18a, 18b, 18c, 18d are connected in parallel through the second wiring sections 17a, 17b, 17c, 17d, respectively. With the structure being illustrated, resonance frequencies of the resonators 15a, 15b, 15c of the first wiring section 14 as the serial arm are substantially corresponding with anti-resonance frequencies of the resonators 18a, 18b, 18c, 18d of the second wiring sections 17a, 17b, 17c, 17d as the parallel arms. A pass band is thereby formed so that a signal within a predetermined band width inputted to the input signal electrode 12 may be outputted from the output signal electrode 13.

Besides, in the present invention including the case that will be hereunder described, the number of the first resonators 15a, 15b, 15c as the serial arm resonators is not restricted to three while the number of the second resonators 18a, 18b, 18c, 18d as the parallel arm resonators is not restricted to four. In other words, in the present invention, one or a plurality of the first resonators 15a, 15b, 15c may be formed while one or a plurality of the second resonators 18a, 18b, 18c, 18d may be formed.

Herein, the single substrate 11 is formed by a piezo-electric single crystal, such as $LiNbO_3$, $LiTaO_3$, crystal and the like, or formed by piezo-electric ceramics, such as lead titanate zirconate piezo-electric ceramics. Alternatively, an insulating substrate on which a piezo-electric thin film, such as a ZnO thin film and the like is formed may be used as the single substrate 11.

Further, each of the first resonators 15a, 15b, 15c and the second resonators 18a, 18b, 18c, 18d is constituted, for example, by an SAW resonator as illustrated in FIG. 5. As illustrated in FIG. 5, the SAW resonator has a pair of electrode fingers each of which has a shape of the teeth of a comb with being involved in each other, namely, transposition finger-shaped electrodes 19a, 19b. With the structure, by applying voltage on the transposition finger-shaped electrode 19a of the input side to be subjected to an electric field, a surface acoustic wave (SAW) is produced on the substrate by piezo-electric effects. On the other hand, mechanical strain due to thus produced surface acoustic wave (SAW) generates an electric field. The electric field is then converted into an electric signal by the transposition finger-shaped electrode 19b of the output side. Besides, a frequency characteristic of the SAW resonator thus mentioned can be varied by changing conditions, such as transposition width of electrodes, the number of pairs of electrodes, or the like.

Besides, reflectors 20 reflecting the surface acoustic wave (SAW) are located at both sides of the SAW resonator.

Further, a capacitance element 21 is located in the second wiring section 17a as the parallel arm with the capacitance element 21 being connected in parallel with the second resonator 18a. Thereby, an effective electric and mechanical coupling factor $keff^2$ of the second resonator 18a is different from those of the first resonators 15a, 15b, 15c and the other second resonators 18b, 18c, 18d. It is enough in this embodiment that the effective electric and mechanical coupling factor $keff^2$ of a part of the second resonators 18a, 18b, 18c, 18d formed in the second wiring sections 17a, 17b, 17c, 17d as the parallel arms is different from those of the other resonators. In other words, similarly to the second resonator 18a, each effective electric and mechanical coupling factor $keff^2$ of a part of the second resonators 18b, 18c, 18d formed in the second wiring sections 17b, 17c, 17d as the parallel arms may be different from those of the other resonators. Besides, in the present invention including the case that will be hereunder described, the capacitance element may be connected in serial with the second resonator.

Herein, the effective electric and mechanical coupling factor $keff^2$ is defined by the following quotation in an impedance characteristic of a resonator, using a frequency fa of the maximum impedance and another frequency fr of the minimum impedance $$keff^2=(fa^2-fr^2)/fr^2\times100(\%)$$

In this embodiment, the effective electric and mechanical coupling factors $keff^2$ of the first resonators 15a, 15b, 15c and the other second resonators 18b, 18c, 18d are determined to be 5.1(%). On the other hand, the effective electric and mechanical coupling factor $keff^2$ of the second resonator 18a is determined to be 0.95(%). However, a value of the effective electric and mechanical coupling factor $keff^2$ is not restricted to those shown in this embodiment. The value of the effective electric and mechanical coupling factor $keff^2$ can be freely determined.

In FIG. 6, illustrated are impedance characteristics of the first resonators 15a, 15b, 15c of the serial arm 14 and the second resonators 18a, 18b, 18c, 18d of the respective parallel arms 17a, 17b, 17c, 17d in the filter device 10 having the constitution thus mentioned. Besides, generally speaking, impedances and frequencies are fairly changed in each of resonators formed in a serial arm and a parallel arm so that required insertion loss and attenuating amount may be achieved. However, in this embodiment, for the brevity of explanation, illustrated are only the respective impedance characteristics of one kind of the resonators 15a, 15b, 15c of the serial arm 14, one kind of the resonators 18b, 18c, 18d of the respective parallel arms 17b, 17c, 17d, and the resonator 18a of the parallel aim 17a that the effective electric and mechanical coupling factor $keff^2$ thereof is different from those of the resonators 15a, 15b, 15c, 18b, 18c, 18d.

Further, in FIG. 7, illustrated is a pass-band characteristic of the filter device 10 according to this embodiment using such the resonators 15a, 15b, 15c, 18a, 18b, 18c, 18d.

Herein, let the above-mentioned index for estimating an attenuation characteristic of a filter device be considered in FIG. 7 so as to estimate an attenuation characteristic of the filter device 10. Namely, let the difference ds between a frequency at which the attenuation is −4 dB and a frequency at which the attenuation is −35 dB be considered in FIG. 7. As will be understood from FIG. 7, the difference as in the lower frequency side of the pass-band is 14.8 MHz. Considering that the difference ds in the lower frequency side of the pass-band of the above-described conventional ladder type filter illustrated in FIG. 3 was 18.2 MHz, it can be understood that sharpness of attenuation characteristic is improved by 3.8 MHz.

Thus, in the filter device 10 according to the first embodiment, the effective electric and mechanical coupling factor $keff^2$ of the resonator 18a formed in the parallel arm 17a is different from those of the other resonators 15a, 15b, 15c, 18b, 18c, and 18d. The filter device 10 thereby becomes capable of obtaining attenuation characteristic of sharpness in a narrow band width. Accordingly, when characteristics of the filter device 10 are varied due to environmental temperature for using the filter device 10 and individual differences of the products thereof, desirable characteristics thereof can be stably obtained.

In particular, as shown in this embodiment, attenuation characteristic of sharpness can be obtained at a frequency side lower than the pass-band by making the effective electric and mechanical coupling factor keff$^2$ of the resonator 18a formed in the parallel arm 17a be different from those of the other resonators 15a, 15b, 15c, 18b, 18c, and 18d.

Besides, a preferable range within which the effective electric and mechanical coupling factor keff$^2$ of a parallel arm resonator is different from that of the other resonator may be, for example, between $1/10$ and $7/10$ of that of a serial arm resonator. In a case that the effective electric and mechanical coupling factors keff$^2$ of serial arm resonators are different from each other, the effective electric and mechanical coupling factor keff$^2$ of the parallel arm resonator should be determined to be between $1/10$ and $7/10$ of an additive mean value of the effective electric and mechanical coupling factors keff$^2$ of the serial arm resonators.

Further, a resonance frequency of the parallel arm resonator (the resonator 18a in this embodiment) of which the effective electric and mechanical coupling factor keff$^2$ is different from those of the other resonators may be determined to be between a frequency in the pass-band side edge in the attenuation band of the filter device 10 and a frequency in the attenuation band side edge in the pass-band of the filter device 10. Preferably, the resonance frequency of the parallel arm resonator (the resonator 18a in this embodiment) of which the effective electric and mechanical coupling factor keff$^2$ is different from those of the other resonators may be determined to be each resonance frequency of the other parallel arm resonators. In addition, an impedance of the parallel arm resonator (the resonator 18a in this embodiment) of which the effective electric and mechanical coupling factor keff$^2$ is different from those of the other resonators may also be determined in correspondence with required characteristics therefor. Besides, the impedance of the parallel arm resonator 18a is determined to be larger than each impedance of the other parallel arm resonators 18b, 18c, and 18d in this embodiment.

Herein, piezo-electric resonators each using bulk acoustic wave (BAW) can be applied to the resonators in the present invention including this embodiment as well as the other embodiments which will be hereunder described.

In FIGS. 8 and 9, illustrated are constitutions of the piezo-electric resonators that can be applied to the resonators in the present invention.

The piezo-electric resonator illustrated in FIG. 8 is such one that is called "diaphragm-type piezo-electric resonator". As illustrated in FIG. 8, the piezo-electric resonator comprises a substrate 11 consisting mainly of silicon or glass, protection layers 22, a piezo-electric film 23, a lower electrode 24, and an upper electrode 25. The protection layers 22 are made, for example of SiO$_2$ film (oxide film) or the like, and formed on both surfaces of the substrate 11. On a principal surface, that is, one of the both surfaces, of the substrate 11, the lower electrode 24 and the upper electrode 25 are stacked with the piezo-electric film 23 consisting of AlN, ZnO or the like being interposed therebetween. Further, in a portion where the lower electrode 24 and the upper electrode 25 are overlapping with each other in the stacked direction, the substrate 11 is partially cut out by an etching method and the like so that the bulk acoustic wave (BAW) may be readily propagating through the substrate 11.

On the other hand, the piezo-electric resonator illustrated in FIG. 9 is such one that is called "SMR (Solidly Mounted Resonator) type piezo-electric resonator". As illustrated in FIG. 9, the piezo-electric resonator comprises a substrate 11, a reflection film member 26, a lower electrode 24, a piezo-electric film 23, a dielectric film 27, and an upper electrode 25. The substrate 11 is consisting mainly of silicon or glass. The reflection film member 26 is stacked on a principal surface of the substrate 11. The reflection film member 26 is consisting of materials of high acoustic impedance, for example, SiO$_2$ films 26a and another materials of low acoustic impedance, for example, AlN films 26b with both the materials being stacked alternately on each other. On the reflection film member 26, the lower electrode 24 and the upper electrode 25 are stacked with the piezo-electric film 23 consisting of AlN, ZnO or the like being interposed therebetween. Further, the dielectric film 27 is consisting, for example of SiO$_2$ film (oxide film) or the like and formed between the piezo-electric film 23 and the upper electrode 25.

Thus, as regards the resonators of the present invention, SAW resonators or piezo electric resonators can be applied to the resonators. On the other hand, as regards means for making the effective electric and mechanical coupling factor keff$^2$ of a part of the resonators be different from those of the other resonators, the following means can be considered in addition to the above-described means, namely, using the capacitance element.

Namely, in a case that SAW resonators are used as the resonators, where film thickness is h and wavelength of surface acoustic wave is $\lambda$, the effective electric and mechanical coupling factor keff$^2$ of a part of resonators can be different from those of the other resonators by making normalized film thickness h/$\lambda$ of the part of resonators be different from those of the other resonators. Alternatively, in a case that L1 is defined as a distance from one side of an electrode finger to the other side of another electrode finger adjacent to the electrode finger and that L2 is defined as a width of an electrode finger, the effective electric and mechanical coupling factor keff$^2$ of a part of resonators can be different from those of the other resonators by making duty L2/L1 of the part of resonators be different from those of the other resonators.

On the other hand, in a case that piezo-electric resonators are used as the resonators, the effective electric and mechanical coupling factor keff$^2$ of a part of the resonators can be different from those of the other resonators by making a film thickness of the SiO$_2$ film formed on a surface of the piezo-electric film 23 (the SiO$_2$ film is the protection layer 22 at the side of the lower electrode 24 in a case shown in FIG. 8 while the SiO$_2$ film is the dielectric film 27 in a case shown in FIG. 9) of the part of the resonators be different from those of the other resonators. Concretely, in a structure shown in FIG. 9, let a film thickness of the dielectric film 27, that is an oxide film, be 50 nm in the resonators 15a, 15b, 15c, 18b, 18c, 18d while let a film thickness of the dielectric film 27, that is an oxide film, be 350 nm in the resonator 18a. So, the effective electric and mechanical coupling factor keff$^2$ of the resonator 18a can be not larger than $5/10$ of those of the other resonators 15a, 15b, 15c, 18b, 18c, 18d. Besides, in the diaphragm-type piezo-electric resonator shown in FIG. 8, the effective electric and mechanical coupling factor keff$^2$ of the resonator can be changed also by forming a dielectric layer under the upper electrode 25.

Alternatively, the effective electric and mechanical coupling factor $keff^2$ has a relation with areas of the lower electrode 24 and the upper electrode 25 as constitutional elements of a resonator. Accordingly the effective electric and mechanical coupling factor $keff^2$ of a part of resonators can be different from those of the other resonators by making the area or areas of one or both of the lower electrode 24 and the upper electrode 25 in the part of resonators be different from those of the other resonators. Further, the effective electric and mechanical coupling factor $keff^2$ also has a relation with film thickness of the lower electrode 24 and the upper electrode 25 as the constitutional elements of the resonator. Consequently, the effective electric and mechanical coupling factor $keff^2$ of a part of resonators can be different from those of the other resonators by making the film thickness of one or both of the lower electrode 24 and the upper electrode 25 in the part of resonators be different from those of the other resonators.

Besides, when an inductor is added to a resonator, a resonance frequency of the resonator is shifted to the lower frequency side. It is therefore considered that the effective electric and mechanical coupling factor $keff^2$ of a predetermined resonator can be different from those of the other resonators by adding the inductor to the predetermined resonator. However, it is necessary that the inductor has an inductance of about 4 through 6 nH. As a result, even if the inductor is formed on the substrate 11 or added from the outside of the substrate 11, the filter device 10 inevitably becomes large in size. On the other hand, in the present invention, the effective electric and mechanical coupling factor $keff^2$ of a predetermined resonator is adjusted by connecting the capacitance element 21 to the predetermined resonator or by changing dimension and the like of the constitutional elements of the predetermined resonator, as mentioned before. The filter device 10 becomes compact in size, although the filter device 10 has attenuation characteristic of sharpness in a narrow band width.

Herein, description is made about a case. In this case, the resonator 18a has a value of the effective electric and mechanical coupling factor $keff^2$ different from those of the resonators 15a, 15b, 15c formed in the serial arm 14 while the resonators 18b, 18c, 18d have the same values thereof as those of the resonators 15a, 15b, 15c. Also in this case, an impedance of the resonator 18a is made lower than those of the resonators 18b, 18c, 18d.

FIG. 12 is a graph for showing impedance characteristics of the resonators thus mentioned in this case. FIG. 13 is a graph for showing a pass-band characteristic of the filter device using the resonators of the impedance characteristics illustrated in FIG. 12. Besides, as shown in FIG. 12, a resonance frequency of the resonator 18a is determined to be higher than resonance frequencies of the resonators 18b, 18c, 18d.

In FIG. 13, let the difference ds be determined in the pass-band characteristic of the filter device 10 using such resonators. Accordingly, the difference ds is determined to be 13.6 MHz. It is therefore understood from FIG. 13 that attenuation characteristic of sharpness can be obtained even in a narrower band width, compared with the filter device 10 having the impedance characteristics illustrated in FIG. 6.

Next, referring to FIGS. 14 through 18, description will proceed to a filter device 10 according to a second embodiment of the present invention.

Figure 14:
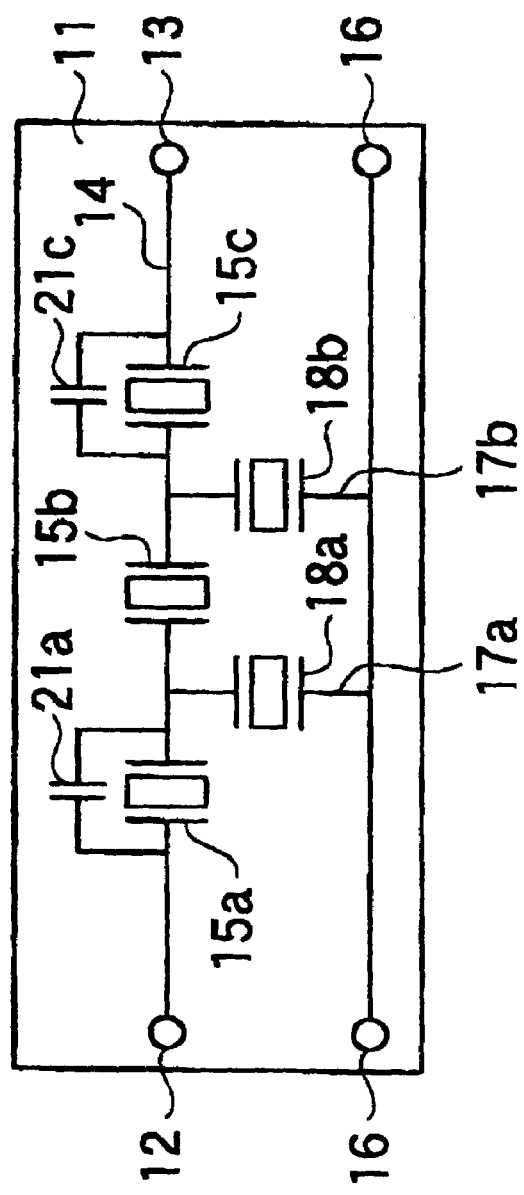
FIG. 14 is an equal circuit diagram for schematically showing a constitution of a filter device according to a second embodiment of the present invention.
Figure 15:
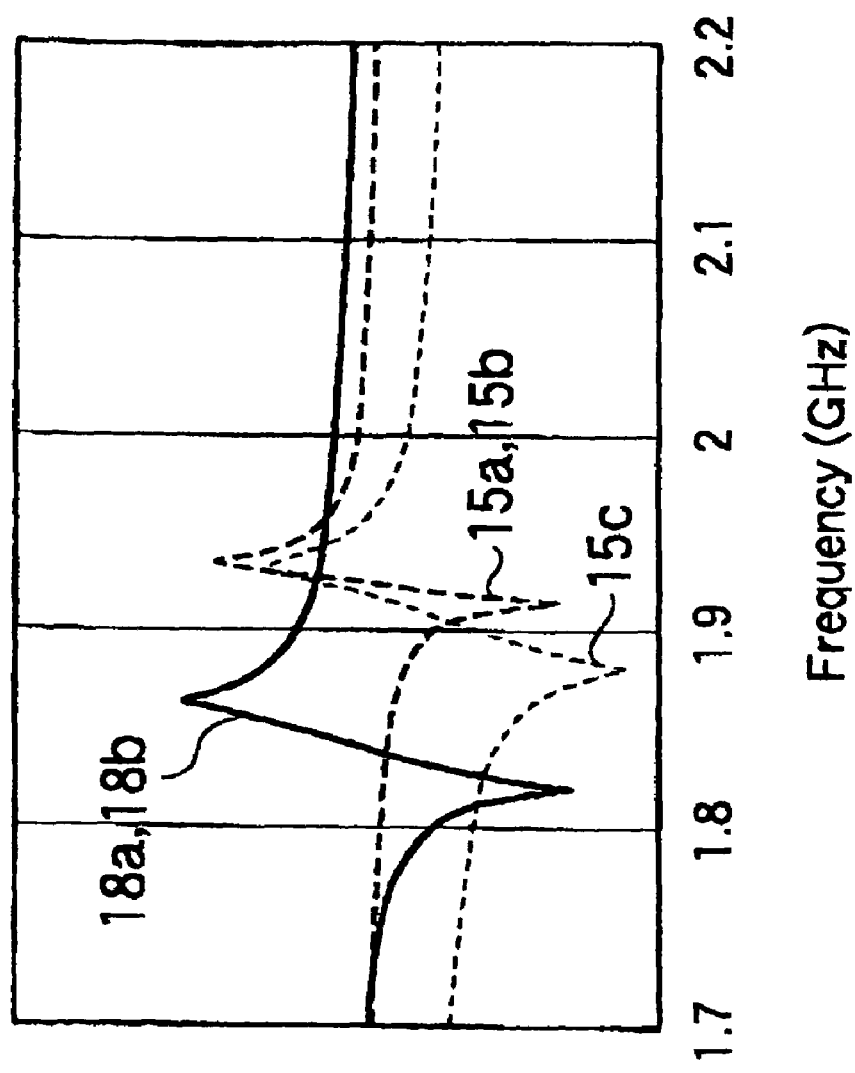
FIG. 15 is a graph for showing an example of impedance characteristics of the resonators in the filter device illustrated in FIG. 14.
Figure 16:
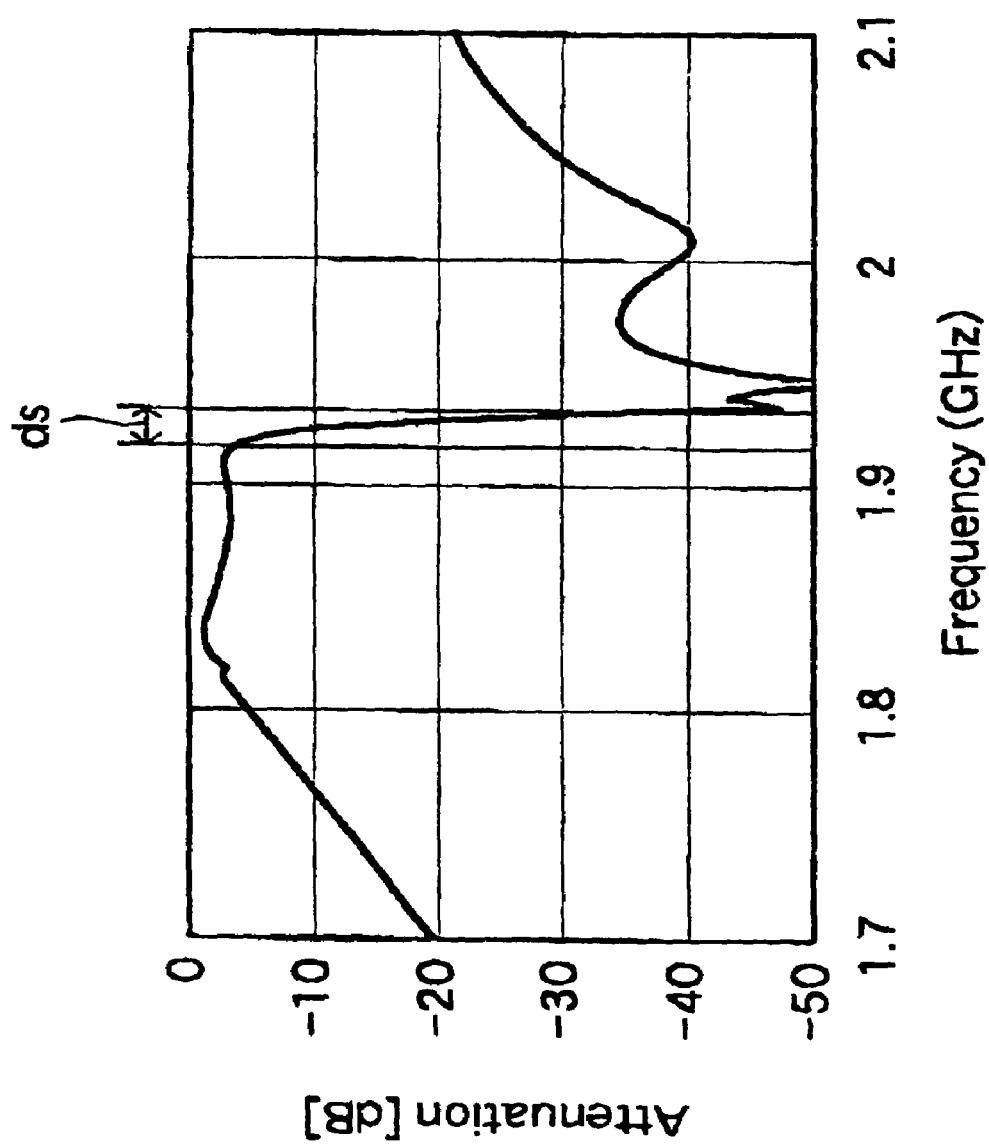
FIG. 16 is a graph for showing a pass-band characteristic of the filter device using the resonators of the impedance characteristics illustrated in FIG. 15.
Figure 17:
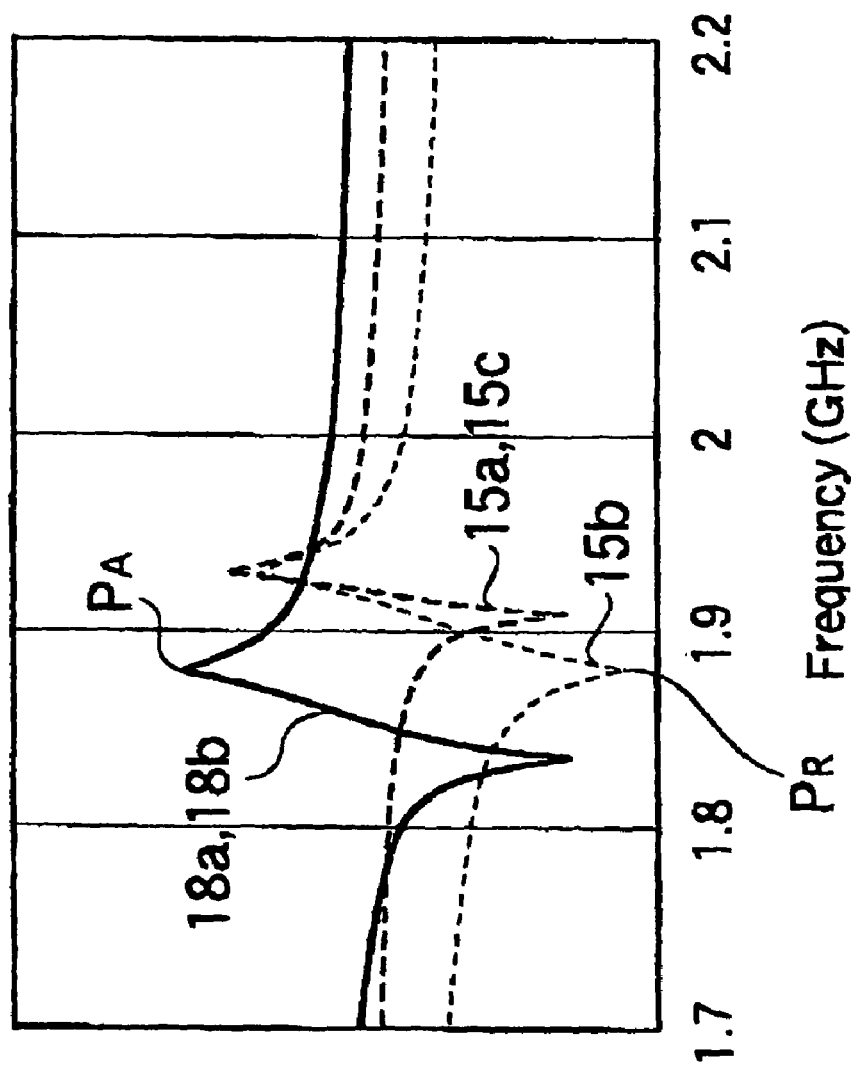
FIG. 17 is a graph for showing another example of impedance characteristics of the resonators in the filter device illustrated in FIG. 14.
Figure 18:
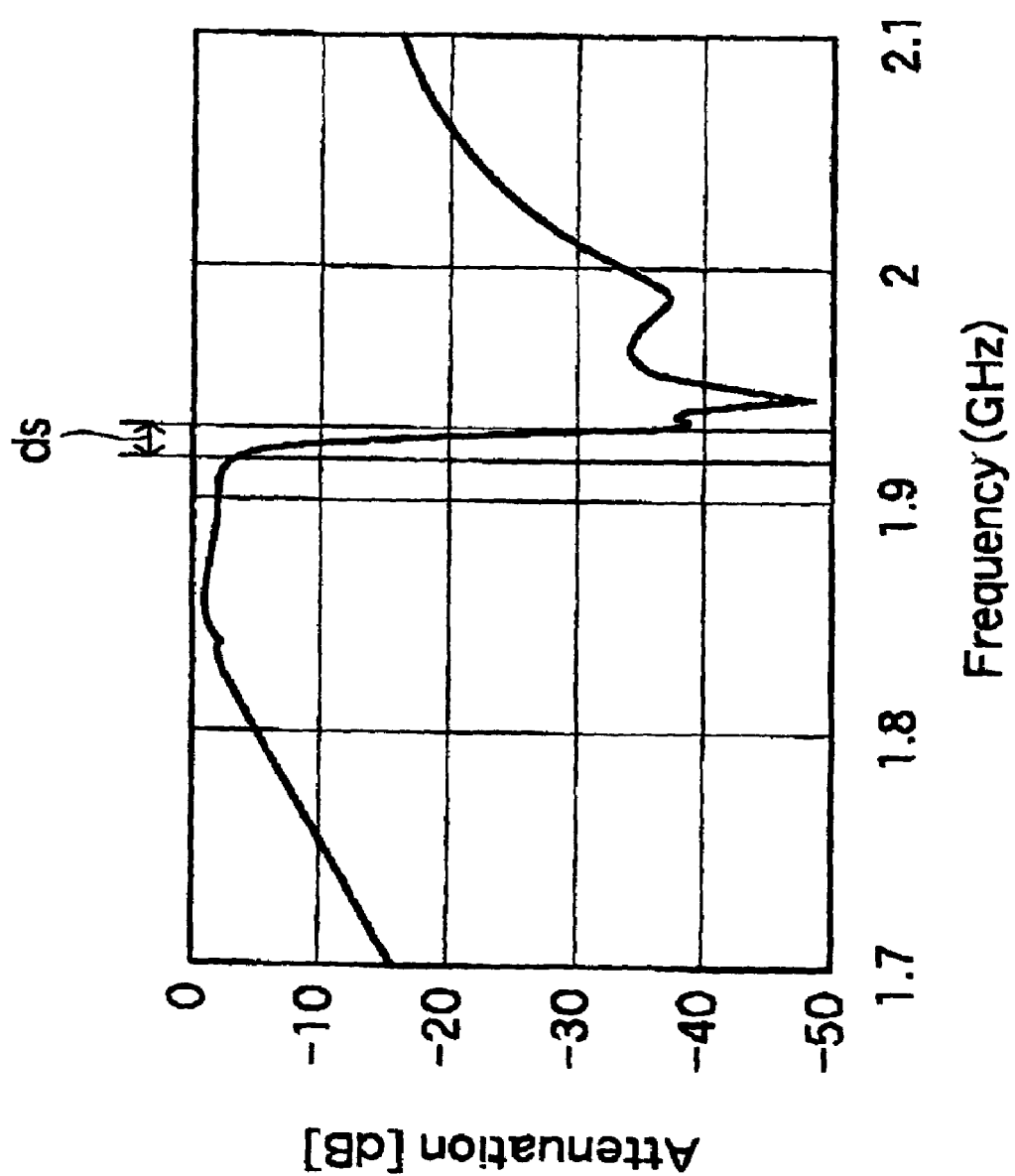
FIG. 18 is a graph for showing a pass-band characteristic of the filter device using the resonators of the impedance characteristics illustrated in FIG. 17.

FIG. 14 is an equal circuit diagram for schematically showing a constitution of the filter device 10 according to the second embodiment of the present invention. FIG. 15 is a graph for showing an example of impedance characteristics of the resonators in the filter device 10 illustrated in FIG. 14. FIG. 16 is a graph for showing a pass-band characteristic of the filter device 10 having the impedance characteristics illustrated in FIG. 15. FIG. 17 is a graph for showing another example of impedance characteristics of the resonators in the filter device 10 illustrated in FIG. 14. FIG. 18 is a graph for showing a pass-band characteristic of the filter device 10 having the impedance characteristics illustrated in FIG. 17.

In FIG. 14, the filter device 10 according to the second embodiment comprises predetermined circuit elements formed on a substrate 11. As illustrated in FIG. 14, the filter device 10 comprises a first wiring section (serial arm) 14, three resonators (first resonators) 15a, 15b, 15c, second wiring sections (parallel arms) 17a, 17b, and two resonators (second resonators) 18a, 18b, as the circuit elements. The first wiring section 14 is formed between an input signal electrode 12 and an output signal electrode 13 as a serial arm. The three resonators 15a, 15b, 15c are connected in serial to the first wiring section 14. The second wiring sections 17a, 17b are formed as parallel arms. The second wiring section 17a is formed between a ground electrode 16 and an intermediate point of the resonator 15a and the resonator 15b. The second wiring section 17b is formed between the ground electrode 16 and an intermediate point of the resonator 15b and the resonator 15c. The two resonators 18a, 18b are connected in parallel through the second wiring sections 17a, 17b, respectively. With the structure being illustrated, resonance frequencies of the resonators 15a, 15b, 15c of the first wiring section 14 as the serial arm are substantially corresponding with anti-resonance frequencies of the resonators 18a, 18b of the second wiring sections 17a, 17b as the parallel arms. A pass band is thereby formed so that a signal within a predetermined band width inputted to the input signal electrode 12 may be outputted from the output signal electrode 13.

Further, a capacitance element 21a is located in the first wiring section 14 as the serial arm with the capacitance element 21a being connected in parallel with the resonator 15a. In addition, a capacitance element 21c is located in the first wiring section 14 as the serial arm with the capacitance element 21c being connected in parallel with the resonator 15c. Thereby, effective electric and mechanical coupling factors $keff^2$ of the resonators 15a, 15c are different from those of the other resonators 15b, 18a, 18b. It is enough in this embodiment that the effective electric and mechanical coupling factor $keff^2$ of a part of the resonators 15a, 16b, 15c formed in the serial arm 14 is different from those of the other resonators. Accordingly, it is enough that the effective electric and mechanical coupling factor $keff^2$ of any one of the resonators 15a, 15c is different from those of the other resonators. Further, it is also enough that the effective electric and mechanical coupling factor $keff^2$ of the resonator 15b is different from those of the other resonators.

In the filter device 10 having a constitution thus mentioned, FIG. 15 shows the impedance characteristics of the resonators of the serial arm and the parallel arms while FIG. 16 shows the pass-band characteristic of the filter device 10 according to this embodiment using the resonators.

In FIG. 16, let the above-mentioned difference ds be considered. As will be understood from FIG. 16, the difference ds in the higher frequency side of the pass-band is 13.5 MHz. As a result, sharpness of attenuation characteristic is so improved, compared with the conventional filter device.

Thus, according to the filter device 10 of the second embodiment of the present invention, the effective electric and mechanical coupling factors $keff^2$ of the resonators 15a, 15c formed in the serial arm 14 are different from those of the other resonators 15*b*, 18*a*, 18*b*. Consequently, the filter device 10 becomes capable of obtaining attenuation characteristic of sharpness in a narrow band width. Accordingly, when characteristics of the filter device 10 are varied due to environmental temperature for using the filter device 10 and individual differences of the products thereof, desirable characteristics thereof can be stably obtained.

Particularly, as depicted in this embodiment, attenuation characteristic of sharpness can be obtained in a frequency side higher than the pass-band of the filter device 10 by making the effective electric and mechanical coupling factors keff$^2$ of the resonators 15*a*, 15*c* formed in the serial arm 14 be different from those of the other resonators.

In this embodiment, the resonators 15*a*, 15*c* have values of the effective electric and mechanical coupling factors keff$^2$ different from those of the resonators 18*a*, 18*b* formed in the parallel arms 17*a*, 17*b*, respectively while the resonator 15*b* has the same value thereof as those of the resonators 18*a*, 18*b*. Under the condition, attenuation characteristic of sharpness can be obtained even in a narrower band width (In this embodiment, in such a narrower band width at a frequency side higher than the pass-band) by making impedance of the resonators 15*a*, 15*c* lower than that of the resonator 15*b*, similarly to the first embodiment in which the impedance of the resonator 18*a* was made lower than those of the resonators 18*b*, 18*c*, 18*d*.

Besides, matching conditions of the pass-band are in disorder, in a case of the filter device 10 according to this embodiment. In view of this, the filter device 10 according to this embodiment is not suitable for a single filter device. It is preferable that the filter device 10 according to this embodiment is applied to a filter device for a shared antenna so that the matching conditions may be fulfilled.

Herein, in FIG. 17, illustrated are impedance characteristics in a case that anti-resonance frequencies $P_A$ of the resonators 18*a*, 18*b* formed in the parallel arms 17*a*, 17*b*, respectively are made higher than resonance frequency $P_R$ of the resonator 15*b* formed in the serial arm 14 and having the same value of the effective electric and mechanical coupling factor keff$^2$ as those of these resonators 18*a*, 18*b*. Besides, the anti-resonance frequencies $P_A$ of the resonators 18*a*, 18*b* are made 1 MHz higher than the resonance frequency $P_R$ of the resonator 15*b* in FIG. 17. Further, in FIG. 18, illustrated is a pass-band characteristic of the filter device 10 using the resonators having such impedance characteristics.

In FIG. 18, let the difference de be determined in the pass-band characteristic of the filter device 10 using such resonators. Accordingly, the difference ds is determined to be 12.4 MHz. It is therefore understood from FIG. 18 that attenuation characteristic of sharpness can be obtained even in a narrower band width.

In the above description, the description was made about cases that the effective electric and mechanical coupling factor keff$^2$ of a part of the serial arm resonators or a part of the parallel arm resonators is different from those of the other resonators. Even in a case that the effective electric and mechanical coupling factors keff$^2$ of all the serial arm resonators and those of all the parallel arm resonators are different from each other, attenuation characteristic of sharpness can also be obtained.

As will be clearly understood from the above descriptions according to the present invention, the Allowing advantageous effects can be obtained Namely, since the effective electric and mechanical coupling factor keff$^2$ of a part of the resonators is different from those of the other resonators, the filter device according to the present invention becomes capable of obtaining attenuation characteristic of sharpness even in a narrow band width. Accordingly, when characteristics of the filter device are varied due to environmental temperature for using the filter device and individual differences of the products thereof, desirable characteristics thereof can be stably obtained.

While the present invention has thus far been described in conjunction with a several embodiments thereof, it will be readily possible for those skilled in the art to put this invention into various other manners For example, in the above embodiments, the present invention was applied to a single filter device itself. However, the present invention can be applied to a branching filter. Namely, the branching filter may be constituted in the present invention by using a plurality of filter devices having pass-bands different from each other.

What is claimed is:

1. A filter device which is constituted by circuit elements formed on a single substrate, said circuit elements comprising:

a first wiring section which is formed between an input signal electrode and an output signal electrode;

at least one first resonator which is located in said first wiring section and which has a predetermined resonance frequency;

at least one second wiring section which is toned between said first wiring section and a ground electrode;

a second resonator which is located in said second wiring section and which has an and-resonance frequency forming a pass-band with said predetermined resonance frequency of said at least one first resonator; and an effective electric and mechanical coupling factor of at least any one of said first and second resonators being different from those of the other resonators, wherein a plurality of said second resonators are located in said second wiring sections, the effective electric and mechanical coupling factor of a part of said second resonators being different from those of the other said second resonators and said first resonator, wherein the part of said second resonators has a value of the effective electric and mechanical coupling factor different from those of the first resonator while the other said second resonators have the same value thereof as those of the first resonator, an impedance of the part of said second resonators being made lower than those of the other said second resonators.

2. A filter device which is constituted by circuit elements formed on a single substrate, said circuit elements comprising:

a first wiring section which is formed between an input signal electrode and an output signal electrode;

at least one first resonator which is located in said first wiring section and which has a predetermined resonance frequency;

at least one second wiring section which is formed between said first wiring section and a ground electrode;

a second resonator which is located in said second wiring section and which has an anti-resonance frequency forming a pass-band with said predetermined resonance frequency of said at least one first resonator; and an effective electric and mechanical coupling factor of at least any one of said first and second resonators being different from those of the other resonators, wherein a plurality of said first resonators are located in said first wiring sections, the effective electric and mechanical coupling factor of a part of said first resonators being different from those of the other said first resonators and said second resonator, wherein a part of said first resonators has a value of the effective electric and mechanical coupling factor different from those of the second resonator while the other said first resonators have the same value thereof as those of the second resonator, an impedance of the part of said first resonators being made lower than those of the other said first resonators.

3. A filter device including circuit elements formed on a single substrate, said circuit elements comprising:

a first wiring section which is formed between an input signal electrode and an output signal electrode;

at least one first resonator which is located in said first wining section and which has a predetermined resonance frequency;

at least one second wiring section which is formed between said first wiring section and a ground electrode;

a second resonator which is located in said second wiring section and which has an anti-resonance frequency forming a pass-band with said predetermined resonance frequency of said at least one first resonator; and an effective electric and mechanical coupling factor of at least any one of said first and second resonators being different from those of the other resonators, wherein said first resonator and said second resonator comprise piezo-electric resonators each using bulk acoustic wave (BAW), wherein a resonance frequency of said resonator of which the effective electric and mechanical coupling factor is different from those of the other resonators is determined to be between a frequency in the pass-band side edge in the attenuation band of the filter device and a frequency in the attenuation band side edge in the pass-band of the filter device, wherein a plurality of said first resonators are located in said first wiring sections, the effective electric and mechanical coupling factor of a part of said first resonators being different from those of the other said first resonators and said second resonator, and wherein anti-resonance frequency of said second resonator is made higher than resonance frequency of said first resonator having the same value of the effective electric and mechanical coupling factor as those of said second resonator.

4. A filter device including circuit elements formed on a single substrate, said circuit elements comprising:

a first wiring section which is formed between an input signal electrode and an output signal electrode;

at least one first resonator which is located in said first wiring section and which has a predetermined resonance frequency;

at least one second wiring section which is formed between said first wiring section and a ground electrode;

a second resonator which is located in said second wiring section and which has an anti-resonance frequency forming a pass-band with said predetermined resonance frequency of said at least one first resonator; and an effective electric and mechanical coupling factor of at least any one of said first and second resonators being different from those of the other resonators, wherein said first resonator and said second resonator comprise piezo-electric resonators each using bulk acoustic wave (BAW), wherein a resonance frequency of said resonator of which the effective electric and mechanical coupling factor is different from those of the other resonators is determined to be between a frequency In the pass-band side edge in the attenuation band of the filter device and a frequency in the attenuation band side edge in the pass-band of the filter device, and wherein the effective electric and mechanical coupling factor of said resonator is different from those of the other resonators by a capacitance element connected in serial to the resonator.

5. A filter device which is constituted by circuit elements formed on a single substrate, said circuit elements comprising:

a first wiring section which is formed between an input signal electrode and an output signal electrode;

at least one first resonator which is located in said first wiring section and which has a predetermined resonance frequency;

at least one second wiring section which is formed between said first wiring section and a ground electrode;

a second resonator which is located in said second wiring section and which has an anti-resonance frequency forming a pass-band with said predetermined resonance frequency of said at least one first resonator; and an effective electric and mechanical coupling factor of at least any one of said first and second resonators being different from those of the other resonators, wherein the effective electric and mechanical coupling factor of said resonator is different from those of the other resonators by making an area of an electrode constituting said resonator be different from those of the other resonators.

* * * * *